United States Patent
Kline

(10) Patent No.: US 7,638,750 B2
(45) Date of Patent: Dec. 29, 2009

(54) OPTICAL POWER FOR ELECTRONIC CIRCUITS USING A SINGLE PHOTOVOLTAIC COMPONENT

(75) Inventor: Bruce Robert Kline, Starksboro, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 12/005,468

(22) Filed: Dec. 26, 2007

(65) Prior Publication Data

US 2009/0166509 A1 Jul. 2, 2009

(51) Int. Cl.
*H03F 3/08* (2006.01)
(52) U.S. Cl. .................. 250/214 R; 136/244; 136/252
(58) Field of Classification Search .......... 250/214 R; 136/252, 244
See application file for complete search history.

(56) References Cited

U.S. PATENT DOCUMENTS

| | | | |
|---|---|---|---|
| 7,042,341 B2 * | 5/2006 | McMahon | 340/426.13 |
| 2004/0159102 A1 * | 8/2004 | Toyomura et al. | 60/641.8 |
| 2005/0061361 A1 * | 3/2005 | Ochi et al. | 136/252 |
| 2005/0268962 A1 * | 12/2005 | Gaudiana et al. | 136/255 |
| 2006/0037380 A1 * | 2/2006 | Bulst et al. | 73/29.01 |
| 2007/0036484 A1 * | 2/2007 | Hyatt | 385/25 |
| 2007/0137688 A1 * | 6/2007 | Yoshida | 136/244 |

OTHER PUBLICATIONS

JDSU, "*High Power Optical Data (HiPOD) System*", www.jdsu.com, 2006 JDS Uniphase Corporation.
Jeff Hecht, "*Photonic Frontiers: Photonic power delivery: Photonic power conversion delivers power via laser beams*", www.LaserFocusWorld.com, 2008 PennWell Corporation, Tulsa, OK, 3 pgs.

* cited by examiner

*Primary Examiner*—Georgia Y Epps
*Assistant Examiner*—Kevin Wyatt
(74) *Attorney, Agent, or Firm*—Muirhead and Saturnelli, LLC

(57) ABSTRACT

Optical power uses light to run remote, isolated circuits without metallic wires. An optical power system may include a single photovoltaic component that supplies a first voltage in response to impingement of light on the photovoltaic component. A voltage booster receives the first voltage from the photovoltaic component and supplies a second voltage signal at a second voltage that is greater than the first voltage. The optical power system may be integrated with a sensor that is powered by the second voltage from the voltage booster. The photovoltaic component may be an inexpensive light emitting diode.

25 Claims, 3 Drawing Sheets

OPTICAL POWER FOR ELECTRONIC CIRCUITS USING A SINGLE PHOTOVOLTAIC COMPONENT

TECHNICAL FIELD

This application relates to the field of providing optical power and, more particularly, to the field of providing optical power to electronic components.

BACKGROUND OF THE INVENTION

Optical power uses light to run remote, isolated circuits without the need for metallic wires to provide electrical power. It is known to use a custom photovoltaic power converter consisting of a number of photodiodes connected in series to optically power a circuit in response to light impinging on the photodiodes. For example, JDSU of Milpitas, Calif. makes a photovoltaic power converter that can power electronic circuits. A series of photodiodes may be used because a single silicon photodiode may not generate enough voltage (aprox. 0.7 volts) to power a circuit. The custom converter may be an expensive part and have few sources of manufacture.

One example application for optical power is the providing of power to a sensor in a fuel tank. It is advantageous to mitigate the potential for a fuel tank explosion by eliminating the use of metallic wires in the fuel tank while still providing power to sensors to monitor conditions in the fuel tank, such as pressure. In other instances, it is useful to reduce weight by eliminating metallic wires. However, as noted above, the use of optical power may result in increased cost due to the need to provide a custom converter with multiple photodiodes to supply sufficient voltage to the sensor or other circuit in the fuel tank.

Accordingly, it would be desirable to provide a system the takes advantage of optical power and yet is still cost efficient.

SUMMARY OF THE INVENTION

According to the system described herein, an optical power system includes a single photovoltaic component that supplies a first voltage in response to impingement of light on the photovoltaic component. A voltage booster is coupled to the photovoltaic component and receives the first voltage from the photovoltaic component and generates a second voltage that is greater than the first voltage. The photovoltaic component may be a light emitting diode that may include a fiber optic connection. The voltage booster may be a charge pump type DC-to-DC step-up converter and/or an inductor type DC-to-DC step-up converter. The inductor type DC-to-DC step-converter may operate for a time after the first voltage is turned off. The first voltage may be less than 3 volts and the second voltage is greater than 3 volts. The voltage booster may include a digital output that indicates a state of the light impinging on the photovoltaic component.

According further to the system described herein, a sensor system includes a single photovoltaic component that supplies a first voltage in response to impingement of light on the photovoltaic component. A voltage booster is coupled to the photovoltaic component that receives the first voltage from the photovoltaic component and supplies a second voltage that is greater than the first voltage. A circuit may be coupled to the voltage booster that receives the second voltage, wherein the second voltage is sufficient to power the circuit. The photovoltaic component may be a light emitting diode. The circuit may be a sensor such as a fuel tank pressure sensor. The circuit may include a communication system, and the communication system may recognize a light modulated communication signal. The photovoltaic component, the voltage booster and the circuit may all be disposed in a housing. Light may be supplied to the photovoltaic component via a fiber optic connection. The voltage booster may be a charge pump type DC-to-DC step-up converter and/or an inductor type DC-to-DC step-up converter. The inductor type DC-to-DC step-converter may operate for a time after the first voltage is turned off. The first voltage may be less than 3 volts and the second voltage is greater than 3 volts, and wherein the circuit requires at least approximately 3 volts to be powered.

According further to the system described herein, a method for optically powering a circuit includes positioning a single photovoltaic component to receive impinging light, wherein the photovoltaic component supplies a first voltage in response to the impinging light. A voltage booster may be coupled to the photovoltaic component, wherein the voltage booster receives the first voltage and supplies a second voltage that is greater than the first voltage. The circuit may be coupled to the voltage booster, wherein the circuit is powered by the second voltage. The photovoltaic component may be a light emitting diode. The circuit may be a fuel tank sensor. The impinging light may be modulated to communicate with the circuit.

BRIEF DESCRIPTION OF THE DRAWINGS

Embodiments of the system are described with reference to the several figures of the drawings, in which.

DETAILED DESCRIPTION OF VARIOUS EMBODIMENTS

Referring now to the figures of the drawings, the figures comprise a part of this specification and illustrate exemplary embodiments of the described system. It is to be understood that in some instances various aspects of the system may be shown schematically or may be exaggerated or altered to facilitate an understanding of the system.

In an embodiment of the system described herein, a light emitting diode (LED) and DC-to-DC voltage booster may be used in an optical power system in place of a custom voltage converter. The LED and DC-to-DC voltage booster components may be off-the-shelf components that are commonly available. An LED may normally be used to emit light but may also be used to generate electric power when exposed to illuminating light, similar to a photodiode but capable of generating a higher voltage (e.g., a little over 1 volt). Circuits are known for taking advantage of the photo-voltaic voltage of an LED in response to light impingement, such as for light sensors, and which may be used in connection with the system described herein. The voltage from the LED, although generally still insufficient to power most circuits, is high enough to run a DC-to-DC voltage booster, for example, that is commonly available to boost the voltage of single cell batteries.

Figure 1:
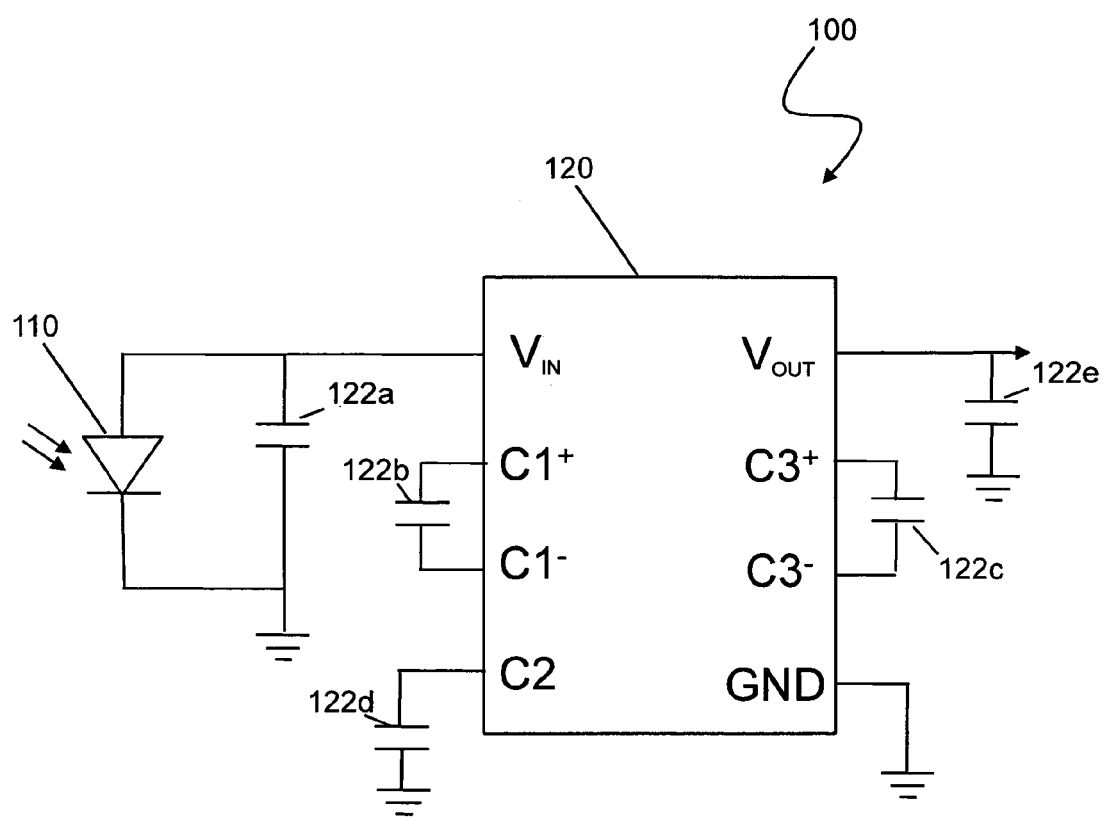
FIG. 1 is a schematic diagram showing an optical power system according to an embodiment of the system described herein.

FIG. 1 is a schematic diagram showing an optical power system 100 according to an embodiment of the system described herein. An LED 110 is shown coupled to a DC-to-DC voltage booster 120. The LED 110 supplies a voltage to the $V_{IN}$ terminal of the voltage booster 120 in response to illuminating light impinging upon the LED. For example, the LED may supply a voltage of a little more than 1 volt to the $V_{IN}$ terminal. In an embodiment, the LED may be from the HFBR-14xx series by Agilent Technologies of Santa Clara, Calif., such as an HFBR-1414 component that includes a fiber optic connection. The voltage booster 120 receives the input voltage at the $V_{IN}$ terminal from the LED 110 and supplies a boosted voltage at the $V_{OUT}$ terminal. For example, the voltage booster 120 may supply an output voltage of 3.3 volts that may be sufficient to power a circuit. For example, the output voltage from the booster 120 may be sufficient to power a sensor, such as a pressure sensor in a fuel tank. Other types of sensors may be used instead of a pressure sensor, such as capacitance, temperature, ultrasonic, and resistance sensors that may measure fuel height, volume, density, flow, contamination, etc.

In an embodiment, the voltage booster 120 may be a regulated charge pump DC/DC step-up converter available from Linear Technology of Milpitas, Calif., such as an LTC1502-3.3 component. External capacitors may be required for appropriate operation of the voltage booster 120, such as the five external capacitors 122a-e that are connected to the $V_{IN}$, $V_{OUT}$, C1+, C1−, C3+, C3− and C2 terminals as shown in FIG. 1. In various embodiments, the capacitors may range from 1 μF to 10 μF.

Figure 2:
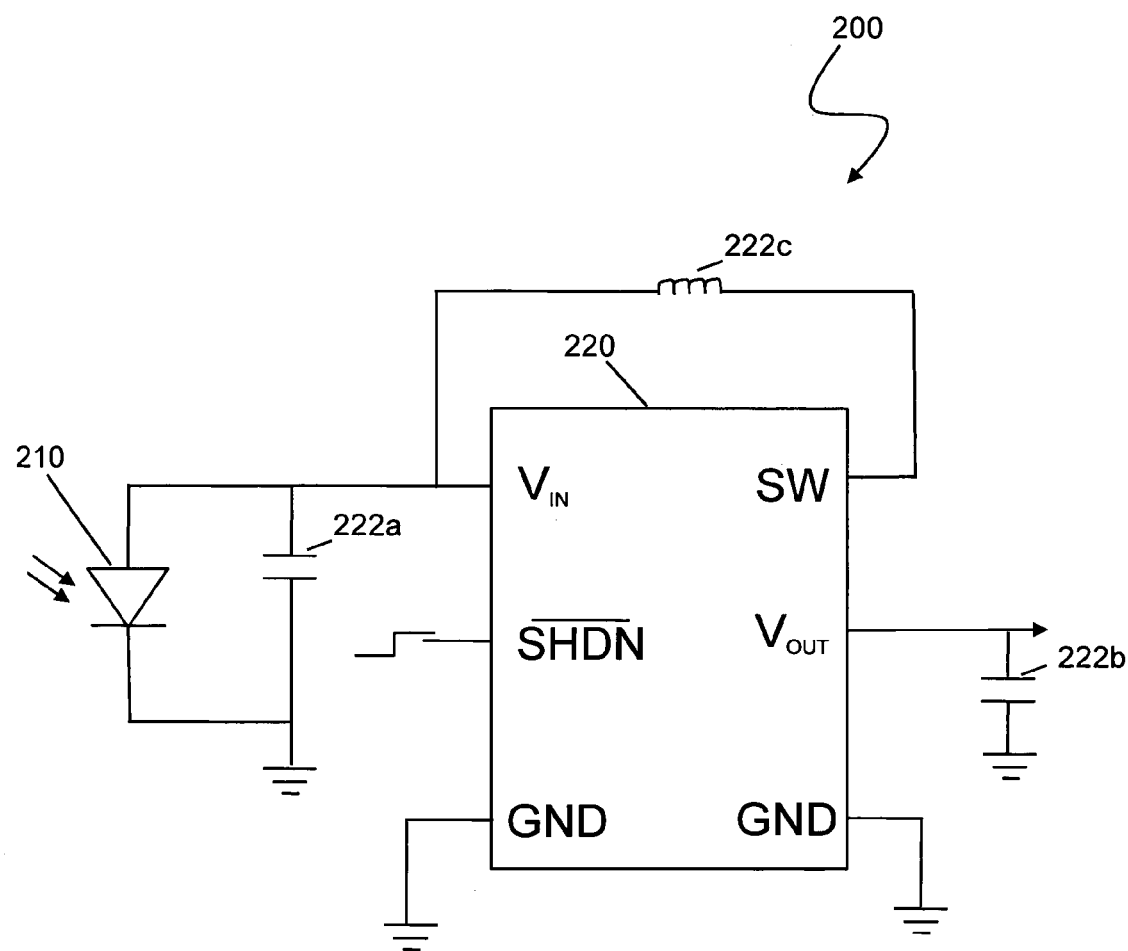
FIG. 2 is a schematic diagram showing an optical power system according to another embodiment of the system described herein.

FIG. 2 is a schematic diagram showing an optical power system 200 according to another embodiment of the system described herein. An LED 210 is shown coupled to a DC-to-DC voltage booster 220. The LED 210 supplies a voltage to $V_{IN}$ of the voltage booster 220 in response to illuminating light impinging upon the LED and may be similar to the LED 110 discussed elsewhere herein. For example, the LED may supply a voltage of a little more than 1 volt to the $V_{IN}$ terminal. The voltage booster 220 may be an inductor-type voltage booster that may be more efficient than a charge pump DC/DC booster such as is shown in connection with FIG. 1. The voltage booster 220 receives an input voltage at the $V_{IN}$ terminal and supplies an output voltage at the $V_{OUT}$ terminal that may be sufficient to power a circuit, such as a sensor. In an embodiment, the voltage booster 220 is a micropower synchronous step-up DC/DC converter available from Linear Technologies of Milpitas, Calif., such as an LTC3525L-3 component that outputs 3 volts. The voltage booster 220 may include external components for appropriate operation, including two capacitors 222a, 222b and an inductor 222c, as shown in FIG. 2. The inductor 222c is shown coupled across the $V_{IN}$ terminal and switch (SW) input terminal. The voltage booster 220 may also include a shutdown control (SHDN) terminal that may be used to turn the voltage booster 220 on and off.

In an embodiment, the voltage booster 220 includes a delayed start-up feature that allows input energy to build up before the voltage booster is turned-on. The delay in start-up may occur since an inductor type booster may require a relatively large start-up current. Additionally, the illuminating light may be turned off for short periods without interrupting the power output of the voltage booster 220. Modulation of the illuminating light may be used to communicate with the sensor or other circuit being powered, as further discussed elsewhere herein. The voltage booster 220 may also include a digital output that indicates the state of the illuminating light.

Figure 3:
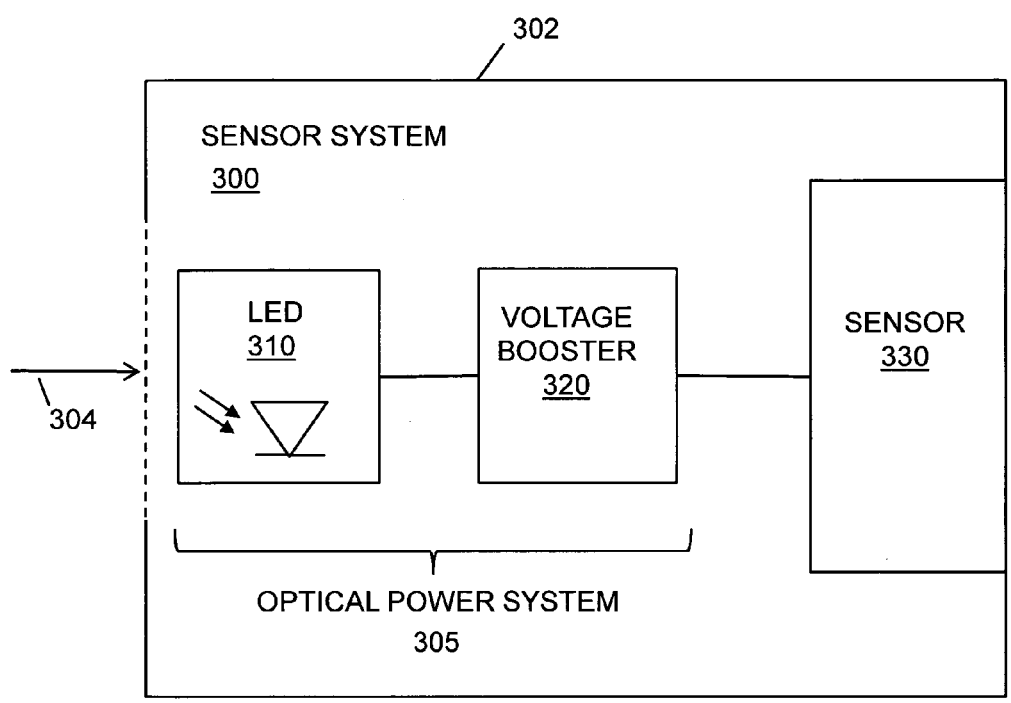
FIG. 3 is a schematic illustration showing a sensor system that may include an optical power system and a sensor, and/or other circuit, according to an embodiment of the system described herein.

FIG. 3 is a schematic illustration showing a sensor system 300 that may include an optical power system 305 and a sensor 330, and/or other circuit, according to an embodiment of the system described herein. The optical power system 305 may include an LED 310 and a voltage booster 320 that may operate similarly to components 110, 210, 120, 220 described elsewhere herein. The optical power system 305 may be coupled to the sensor 330, and the optical power system 305 and sensor 330 may be disposed in a housing 302. The housing 302 of the sensor system 300 may provide for an optical path 304 that permits illuminating light to be received at the LED 310. In an embodiment, the optical path 304 to the LED 310 may be via a fiber optic communication link. The connection for the fiber optic communication link may be integrated with the LED 310. Modulation of the illuminating light may be used to communicate with the sensor 330. Accordingly, the sensor 330 may include a communication system that recognizes a light modulated signal. Other communication systems may also be used in connection with the system described herein, including, for example, wireless communication in which the sensor 330 receives a wirelessly transmitted signal and/or wirelessly transmits a signal containing sensor data.

Other components may be used with the system described herein, including other types of LEDs and/or photovoltaic components other than LEDs that generate sufficient voltage to run a DC-to-DC converter and/or other type of voltage booster component. For example, gallium arsenide photodiodes may be used.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. An optical power system, comprising:
a single photovoltaic component that supplies a first voltage in response to impingement of light on the photovoltaic component, wherein the single photovoltaic component is a single diode;
a voltage booster coupled to the photovoltaic component that receives the first voltage from the photovoltaic component and generates a second voltage that is greater than the first voltage, wherein the voltage booster is powered using only the first voltage from the single photovoltaic component, and wherein the first voltage is greater than 1 volt.

2. The optical power system according to claim 1, wherein the photovoltaic component is a light emitting diode.

3. The optical power system according to claim 2, wherein the light emitting diode includes a fiber optic connection.

4. The optical power system according to claim 1, wherein the voltage booster is a charge pump type DC-to-DC step-up converter.

5. The optical power system according to claim 1, wherein the voltage booster is an inductor type DC-to-DC step-up converter.

6. The optical power system according to claim 5, wherein the inductor type DC-to-DC step-converter operates for a time after the first voltage is turned off.

7. The optical power system according to claim 1, wherein the first voltage is less than 3 volts and the second voltage is greater than 3 volts.

8. The optical power system according to claim 1, wherein the voltage booster includes a digital output that indicates a state of the light impinging on the photovoltaic component.

9. A sensor system, comprising:
   a single photovoltaic component that supplies a first voltage in response to impingement of light on the photovoltaic component, wherein the single photovoltaic component is a single diode;
   a voltage booster coupled to the photovoltaic component that receives the first voltage from the photovoltaic component and supplies a second voltage that is greater than the first voltage, wherein the voltage booster is powered using only the first voltage from the single photovoltaic component, and wherein the first voltage is greater than 1 volt; and
   a circuit coupled to the voltage booster that receives the second voltage, wherein the second voltage is sufficient to power the circuit.

10. The sensor system according to claim 9, wherein the photovoltaic component is a light emitting diode.

11. The sensor system according to claim 9, wherein the circuit is a sensor.

12. The sensor system according to claim 11, wherein the sensor is a fuel tank pressure sensor.

13. The sensor system according to claim 9, wherein the circuit includes a communication system.

14. The sensor system according to claim 13, wherein the communication system recognizes a light modulated communication signal.

15. The sensor system according to claim 9, further comprising:
   a housing, wherein the photovoltaic component, the voltage booster and the circuit are disposed in the housing.

16. The sensor system according to claim 9, wherein light is supplied to the photovoltaic component via a fiber optic connection.

17. The sensor system according to claim 9, wherein the voltage booster is a charge pump type DC-to-DC step-up converter.

18. The sensor system according to claim 9, wherein the voltage booster is an inductor type DC-to-DC step-up converter.

19. The sensor system according to claim 18, wherein the inductor type DC-to-DC step-converter operates for a time after the first voltage is turned off.

20. The sensor system according to claim 9, wherein the first voltage is less than 3 volts and the second voltage is greater than 3 volts, and wherein the circuit requires at least approximately 3 volts to be powered.

21. The sensor system according to claim 9, wherein the voltage booster includes a digital output that indicates a state of the light impinging on the photovoltaic component.

22. A method for optically powering a circuit, comprising:
   positioning a single photovoltaic component to receive impinging light, wherein the photovoltaic component supplies a first voltage in response to the impinging light, and wherein the single photovoltaic component is a single diode;
   coupling a voltage booster to the photovoltaic component, wherein the voltage booster receives the first voltage and supplies a second voltage that is greater than the first voltage, and wherein the voltage booster is powered using only the first voltage from the single photovoltaic component, and wherein the first voltage is greater than 1 volt; and
   coupling the circuit to the voltage booster, wherein the circuit is powered by the second voltage.

23. The method according to claim 22, wherein the photovoltaic component is a light emitting diode.

24. The method according to claim 22, wherein the circuit is a fuel tank sensor.

25. The method according to claim 22, further comprising:
   modulating the impinging light to communicate with the circuit.

* * * * *